(12) United States Patent
Rosenberg (10) Patent No.: US 9,509,269 B1
(45) Date of Patent: Nov. 29, 2016

(54) AMBIENT SOUND RESPONSIVE MEDIA PLAYER

(75) Inventor: Louis B. Rosenberg, Pismo Beach, CA (US)

(73) Assignee: GOOGLE INC., Mountain View, CA (US)

( * ) Notice: Subject to any disclaimer, the term of this patent is extended or adjusted under 35 U.S.C. 154(b) by 340 days.

(21) Appl. No.: 13/615,873

(22) Filed: Sep. 14, 2012

Related U.S. Application Data (60) Division of application No. 11/697,706, filed on Apr. 7, 2007, now abandoned, which is a continuation-in-part of application No. 11/267,079, filed on Nov. 3, 2005, now Pat. No. 7,542,816, and a continuation-in-part of application No. 11/223,368, filed on Sep. 9, 2005, now abandoned, and a continuation-in-part of application No. 11/610,615, filed on Dec. 14, 2006, now Pat. No. 7,603,414.

(60) Provisional application No. 60/665,291, filed on Mar. 26, 2005, provisional application No. 60/648,197, filed on Jan. 27, 2005, provisional application No. 60/644,417, filed on Jan. 15, 2005, provisional application No. 60/793,214, filed on Apr. 19, 2006, provisional application No. 60/841,990, filed on Aug. 31, 2006.

(51) Int. Cl.
*H03G 3/32* (2006.01)
*H03G 3/20* (2006.01)

(52) U.S. Cl.
CPC . *H03G 3/32* (2013.01); *H03G 3/20* (2013.01)

(58) Field of Classification Search
CPC .......... H04R 29/00; H03G 3/20; H03G 3/00; H03G 3/32

USPC ..................................... 381/56–57, 104, 107
See application file for complete search history.

(56) References Cited

U.S. PATENT DOCUMENTS

| 4,018,121 A | 4/1977 | Chowning |
| 4,054,749 A | 10/1977 | Suzuki et al. |
| 4,091,302 A | 5/1978 | Yamashita |

(Continued)

FOREIGN PATENT DOCUMENTS

| DE | 19650900 | 6/1998 |
| GB | 0503253.7 | 2/2005 |

(Continued)

OTHER PUBLICATIONS

Nilsson, "ID3 tag version 2", Informal standard, Document: id3v2-00.txt, pp. 1-28, Mar. 1998.

(Continued)

*Primary Examiner* — Disler Paul
(74) *Attorney, Agent, or Firm* — Morris and Kamlay LLP (57) ABSTRACT

Some embodiments of the present invention provide a method of adjusting an output of a media player comprising capturing an ambient audio signal; processing the ambient audio signal to determine whether one or more characteristic forms are present within the ambient audio signal; and reducing an output of a media player from a first volume to a second volume if the one or more characteristic forms are present within the ambient audio signal. The characteristic forms may be, for example, a name or personal identifier of a user of the media player, the voice of a user of the media player, or an alarm or siren.

19 Claims, 2 Drawing Sheets

(56) References Cited

U.S. PATENT DOCUMENTS

| | | |
|---|---|---|
| 4,360,345 A | 11/1982 | Hon |
| 4,403,208 A | 9/1983 | Hodgson et al. |
| 4,430,595 A | 2/1984 | Nakasone et al. |
| 4,490,810 A | 12/1984 | Hon |
| 4,712,101 A | 12/1987 | Culver |
| 4,823,634 A | 4/1989 | Culver |
| 4,868,549 A | 9/1989 | Affinito et al. |
| 4,907,973 A | 3/1990 | Hon |
| 4,919,418 A | 4/1990 | Miller |
| 4,934,694 A | 6/1990 | McIntosh |
| 4,949,089 A | 8/1990 | Ruszkowski, Jr. |
| 4,983,901 A | 1/1991 | Lehmer |
| 5,031,914 A | 7/1991 | Rosenthal |
| 5,047,918 A | 9/1991 | Schwartz et al. |
| 5,047,952 A | 9/1991 | Kramer et al. |
| 5,164,530 A | 11/1992 | Iwase |
| 5,185,561 A | 2/1993 | Good et al. |
| 5,186,629 A | 2/1993 | Rohen |
| 5,189,355 A | 2/1993 | Larkins et al. |
| 5,220,260 A | 6/1993 | Schuler |
| 5,243,659 A * | 9/1993 | Stafford ............... A42B 3/303 381/110 |
| 5,263,715 A | 11/1993 | Matsumoto et al. |
| 5,273,038 A | 12/1993 | Beavin |
| 5,296,846 A | 3/1994 | Ledley |
| 5,296,871 A | 3/1994 | Paley |
| 5,359,527 A | 10/1994 | Takanabe et al. |
| 5,442,557 A | 8/1995 | Kaneko |
| 5,451,192 A | 9/1995 | Hefele |
| 5,499,360 A | 3/1996 | Barbara et al. |
| 5,534,917 A | 7/1996 | MacDougall |
| 5,559,412 A | 9/1996 | Schuler |
| 5,572,201 A | 11/1996 | Graham et al. |
| 5,614,687 A | 3/1997 | Yamada et al. |
| 5,629,594 A | 5/1997 | Jacobus et al. |
| 5,634,051 A | 5/1997 | Thomson |
| 5,643,087 A | 7/1997 | Marcus et al. |
| 5,666,138 A | 9/1997 | Culver |
| 5,690,582 A | 11/1997 | Ulrich et al. |
| 5,699,441 A | 12/1997 | Sagawa et al. |
| 5,701,140 A | 12/1997 | Rosenberg et al. |
| 5,704,791 A | 1/1998 | Gillio |
| 5,709,219 A | 1/1998 | Chen et al. |
| 5,721,566 A | 2/1998 | Rosenberg et al. |
| 5,724,264 A | 3/1998 | Rosenberg et al. |
| 5,728,960 A | 3/1998 | Sitrick |
| 5,731,804 A | 3/1998 | Rosenberg |
| 5,734,373 A | 3/1998 | Rosenberg et al. |
| 5,739,811 A | 4/1998 | Rosenberg et al. |
| 5,742,278 A | 4/1998 | Chen et al. |
| 5,747,714 A | 5/1998 | Kniest et al. |
| 5,754,023 A | 5/1998 | Roston et al. |
| 5,755,577 A | 5/1998 | Gillio |
| 5,767,839 A | 6/1998 | Rosenberg |
| 5,769,640 A | 6/1998 | Jacobus et al. |
| 5,778,077 A * | 7/1998 | Davidson ............... H03G 3/32 340/4.37 |
| 5,791,908 A | 8/1998 | Gillio |
| 5,800,177 A | 9/1998 | Gillio |
| 5,800,178 A | 9/1998 | Gillio |
| 5,807,267 A | 9/1998 | Bryars et al. |
| 5,821,920 A | 10/1998 | Rosenberg et al. |
| 5,825,308 A | 10/1998 | Rosenberg |
| 5,828,197 A | 10/1998 | Martin et al. |
| 5,839,901 A | 11/1998 | Karkanen |
| 5,857,939 A | 1/1999 | Kaufman |
| 5,870,740 A | 2/1999 | Rose et al. |
| 5,882,206 A | 3/1999 | Gillio |
| 5,889,670 A | 3/1999 | Schuler et al. |
| 5,889,672 A | 3/1999 | Schuler et al. |
| 5,890,128 A | 3/1999 | Diaz et al. |
| 5,890,152 A | 3/1999 | Rapaport et al. |
| 5,890,995 A | 4/1999 | Bobick et al. |
| 5,897,437 A | 4/1999 | Nishiumi et al. |
| 5,928,248 A | 7/1999 | Acker |
| 5,941,837 A | 8/1999 | Amano et al. |
| 5,952,596 A | 9/1999 | Kondo |
| 5,953,693 A | 9/1999 | Sakiyama et al. |
| 5,959,613 A | 9/1999 | Rosenberg et al. |
| 5,989,188 A | 11/1999 | Birkhoelzer et al. |
| 6,024,576 A | 2/2000 | Bevirt et al. |
| 6,041,311 A | 3/2000 | Chislenko et al. |
| 6,088,017 A | 7/2000 | Tremblay et al. |
| 6,096,004 A | 8/2000 | Meglan et al. |
| 6,106,301 A | 8/2000 | Merril |
| 6,111,577 A | 8/2000 | Zilles et al. |
| 6,119,114 A | 9/2000 | Smadja |
| 6,122,520 A | 9/2000 | Want et al. |
| 6,154,201 A | 11/2000 | Levin et al. |
| 6,160,489 A | 12/2000 | Perry et al. |
| 6,192,340 B1 | 2/2001 | Abecassis |
| 6,199,067 B1 | 3/2001 | Geller |
| 6,211,861 B1 | 4/2001 | Rosenberg et al. |
| 6,221,861 B1 | 4/2001 | Seegmiller |
| 6,230,047 B1 | 5/2001 | McHugh |
| 6,244,742 B1 | 6/2001 | Yamada et al. |
| 6,248,946 B1 | 6/2001 | Dwek |
| 6,256,011 B1 | 7/2001 | Culver |
| 6,287,262 B1 | 9/2001 | Amano et al. |
| 6,292,747 B1 | 9/2001 | Amro et al. |
| 6,298,323 B1 | 10/2001 | Kaemmerer |
| 6,300,938 B1 | 10/2001 | Culver |
| 6,304,520 B1 | 10/2001 | Watanabe |
| 6,314,094 B1 | 11/2001 | Boys |
| 6,323,412 B1 | 11/2001 | Loo |
| 6,366,272 B1 | 4/2002 | Rosenberg et al. |
| 6,376,971 B1 | 4/2002 | Pelrine et al. |
| 6,401,027 B1 | 6/2002 | Xu et al. |
| 6,401,037 B1 | 6/2002 | Muller et al. |
| 6,411,896 B1 | 6/2002 | Shuman et al. |
| 6,417,782 B1 | 7/2002 | Darnall |
| 6,429,846 B2 | 8/2002 | Rosenberg et al. |
| 6,470,207 B1 | 10/2002 | Simon et al. |
| 6,470,302 B1 | 10/2002 | Cunningham et al. |
| 6,477,239 B1 | 11/2002 | Ohki et al. |
| 6,498,982 B2 | 12/2002 | Bellesfield et al. |
| 6,501,420 B2 | 12/2002 | Townsend et al. |
| 6,515,593 B1 | 2/2003 | Stark et al. |
| 6,522,292 B1 | 2/2003 | Ellenby et al. |
| 6,526,411 B1 | 2/2003 | Ward |
| 6,529,831 B1 | 3/2003 | Smith et al. |
| 6,539,232 B2 | 3/2003 | Hendrey et al. |
| 6,563,487 B2 | 5/2003 | Martin et al. |
| 6,564,210 B1 | 5/2003 | Korda et al. |
| 6,598,707 B2 | 7/2003 | Nakagaki et al. |
| 6,618,593 B1 | 9/2003 | Drutman et al. |
| 6,623,427 B2 | 9/2003 | Mandigo |
| 6,626,728 B2 | 9/2003 | Holt |
| 6,636,835 B2 | 10/2003 | Ragsdale-Elliott et al. |
| 6,640,187 B1 | 10/2003 | Chenault et al. |
| 6,655,817 B2 | 12/2003 | Devlin et al. |
| 6,657,116 B1 | 12/2003 | Gunnerson |
| 6,665,644 B1 | 12/2003 | Kanevsky et al. |
| 6,671,736 B2 | 12/2003 | Virine et al. |
| 6,683,538 B1 | 1/2004 | Wilkes, Jr. |
| 6,686,531 B1 | 2/2004 | Pennock et al. |
| 6,686,911 B1 | 2/2004 | Levin et al. |
| 6,697,044 B2 | 2/2004 | Shahoian et al. |
| 6,697,048 B2 | 2/2004 | Rosenberg et al. |
| 6,721,706 B1 | 4/2004 | Strubbe et al. |
| 6,732,090 B2 | 5/2004 | Shanahan et al. |
| 6,735,568 B1 | 5/2004 | Buckwalter et al. |
| 6,746,246 B2 | 6/2004 | Cliff |
| 6,749,537 B1 | 6/2004 | Hickman |
| 6,757,396 B1 | 6/2004 | Allred |
| 6,765,495 B1 | 7/2004 | Dunning et al. |
| 6,768,066 B2 | 7/2004 | Wehrenberg |
| 6,768,246 B2 | 7/2004 | Pelrine et al. |
| 6,772,026 B2 | 8/2004 | Bradbury et al. |
| 6,778,226 B1 | 8/2004 | Eshelman et al. |
| 6,781,289 B2 | 8/2004 | Heinz et al. |
| 6,801,837 B2 | 10/2004 | Carlstedt et al. |
| 6,804,643 B1 | 10/2004 | Kiss |
| 6,808,472 B1 | 10/2004 | Hickman |

(56) References Cited

U.S. PATENT DOCUMENTS

| | | |
|---|---|---|
| 6,812,394 B2 | 11/2004 | Weissflog |
| 6,812,624 B1 | 11/2004 | Pei et al. |
| 6,816,711 B2 | 11/2004 | Standke et al. |
| 6,819,267 B1 | 11/2004 | Edmark et al. |
| 6,822,635 B2 | 11/2004 | Shahoian et al. |
| 6,829,599 B2 | 12/2004 | Chidlovskii |
| 6,858,970 B2 | 2/2005 | Malkin et al. |
| 6,863,220 B2 | 3/2005 | Selker |
| 6,867,733 B2 | 3/2005 | Sandhu et al. |
| 6,871,142 B2 | 3/2005 | Kumada et al. |
| 6,879,284 B2 | 4/2005 | Dufek |
| 6,882,086 B2 | 4/2005 | Kornbluh et al. |
| 6,885,362 B2 | 4/2005 | Suomela |
| 6,888,457 B2 | 5/2005 | Wilkinson et al. |
| 6,906,533 B1 | 6/2005 | Yoshida |
| 6,906,643 B2 | 6/2005 | Samadani et al. |
| 6,915,295 B2 | 7/2005 | Okamoto et al. |
| 6,917,373 B2 | 7/2005 | Vong et al. |
| 6,921,351 B1 | 7/2005 | Hickman et al. |
| 6,929,481 B1 | 8/2005 | Alexander et al. |
| 6,941,324 B2 | 9/2005 | Plastina et al. |
| 6,950,695 B2 | 9/2005 | Chen |
| 6,956,538 B2 | 10/2005 | Moore |
| 6,958,707 B1 | 10/2005 | Siegel |
| 6,965,770 B2 | 11/2005 | Walsh et al. |
| 6,965,842 B2 | 11/2005 | Rekimoto |
| 6,968,179 B1 | 11/2005 | De Vries |
| 6,970,088 B2 | 11/2005 | Kovach |
| 6,970,571 B2 | 11/2005 | Knorr et al. |
| 6,978,684 B2 | 12/2005 | Nurse |
| 6,982,697 B2 | 1/2006 | Wilson et al. |
| 6,982,700 B2 | 1/2006 | Rosenberg et al. |
| 6,983,139 B2 | 1/2006 | Dowling et al. |
| 6,985,143 B2 | 1/2006 | Pharr |
| 6,986,320 B2 | 1/2006 | Shelton et al. |
| 6,987,221 B2 | 1/2006 | Platt |
| 7,003,122 B2 | 2/2006 | Chen |
| 7,007,001 B2 | 2/2006 | Oliver et al. |
| 7,012,593 B2 | 3/2006 | Yoon et al. |
| 7,020,292 B1 | 3/2006 | Heubel et al. |
| 7,023,423 B2 | 4/2006 | Rosenberg |
| 7,027,823 B2 | 4/2006 | Mikuni |
| 7,031,875 B2 | 4/2006 | Ellenby et al. |
| 7,046,588 B2 | 5/2006 | Heo |
| 7,075,000 B2 | 7/2006 | Gang et al. |
| 7,092,964 B1 | 8/2006 | Dougherty et al. |
| 7,100,835 B2 | 9/2006 | Selker |
| 7,106,868 B2 | 9/2006 | Daly |
| 7,136,945 B2 | 11/2006 | Gibbs et al. |
| 7,138,575 B2 | 11/2006 | Childs, Jr. et al. |
| 7,156,773 B2 | 1/2007 | Takai et al. |
| 7,166,062 B1 | 1/2007 | Watterson et al. |
| 7,181,438 B1 | 2/2007 | Szabo |
| 7,199,708 B2 | 4/2007 | Terauchi et al. |
| 7,207,935 B1 | 4/2007 | Lipo |
| 7,225,565 B2 | 6/2007 | DiBenedetto et al. |
| 7,227,071 B2 | 6/2007 | Tagawa et al. |
| 7,229,416 B2 | 6/2007 | Chen |
| 7,232,416 B2 | 6/2007 | Czernicki |
| 7,249,126 B1 | 7/2007 | Ginsburg et al. |
| 7,271,736 B2 | 9/2007 | Siegel et al. |
| 7,283,997 B1 | 10/2007 | Howard, Jr. et al. |
| RE39,906 E | 11/2007 | Roston et al. |
| 7,293,060 B2 | 11/2007 | Komsi |
| 7,310,676 B2 | 12/2007 | Bourne |
| 7,310,895 B2 | 12/2007 | Whittlesey et al. |
| 7,312,766 B1 | 12/2007 | Edwards |
| 7,312,785 B2 | 12/2007 | Tsuk et al. |
| 7,330,112 B1 | 2/2008 | Emigh et al. |
| 7,343,317 B2 | 3/2008 | Jokinen et al. |
| 7,344,508 B2 | 3/2008 | Surina |
| 7,348,967 B2 | 3/2008 | Zadesky et al. |
| 7,359,624 B2 | 4/2008 | Adams et al. |
| 7,373,820 B1 | 5/2008 | James |
| 7,383,457 B1 | 6/2008 | Knight |
| 7,489,979 B2 | 2/2009 | Rosenberg |
| 7,519,537 B2 | 4/2009 | Rosenberg |
| 7,542,816 B2 | 6/2009 | Rosenberg |
| 7,555,132 B2 * | 6/2009 | Hsieh .................. H03G 1/0088 348/738 |
| 7,586,032 B2 | 9/2009 | Louis |
| 7,603,414 B2 | 10/2009 | Rosenberg |
| 7,613,531 B2 | 11/2009 | Korst et al. |
| 7,720,686 B2 | 5/2010 | Volk et al. |
| 7,729,945 B1 | 6/2010 | Katz et al. |
| 7,765,326 B2 | 7/2010 | Robbin et al. |
| 7,907,941 B2 | 3/2011 | Twitchell |
| 8,085,943 B2 | 12/2011 | Bizjak |
| 8,594,341 B2 * | 11/2013 | Rothschild ............. H04H 60/04 381/123 |
| 2001/0003542 A1 | 6/2001 | Kita |
| 2001/0026624 A1 * | 10/2001 | Kon .................... H03G 3/3089 381/104 |
| 2001/0034740 A1 | 10/2001 | Kerne |
| 2001/0041647 A1 | 11/2001 | Itoh et al. |
| 2001/0046304 A1 * | 11/2001 | Rast .................... H04R 1/1041 381/74 |
| 2001/0054032 A1 | 12/2001 | Goldman et al. |
| 2002/0008635 A1 | 1/2002 | Ewing et al. |
| 2002/0016786 A1 | 2/2002 | Pitkow et al. |
| 2002/0054060 A1 | 5/2002 | Schena |
| 2002/0078045 A1 | 6/2002 | Dutta |
| 2002/0091049 A1 | 7/2002 | Hisano et al. |
| 2002/0091848 A1 | 7/2002 | Agresta et al. |
| 2002/0116263 A1 | 8/2002 | Gouge |
| 2002/0116476 A1 | 8/2002 | Eyal et al. |
| 2002/0123988 A1 | 9/2002 | Dean et al. |
| 2002/0133418 A1 | 9/2002 | Hammond et al. |
| 2002/0141599 A1 | 10/2002 | Trajkovic et al. |
| 2002/0142701 A1 | 10/2002 | Rosenberg |
| 2002/0147628 A1 | 10/2002 | Specter et al. |
| 2002/0152077 A1 | 10/2002 | Patterson |
| 2002/0183118 A1 | 12/2002 | Wolinsky |
| 2002/0186221 A1 | 12/2002 | Bell |
| 2003/0009497 A1 | 1/2003 | Yu |
| 2003/0011467 A1 | 1/2003 | Suomela |
| 2003/0033287 A1 | 2/2003 | Shanahan et al. |
| 2003/0035551 A1 | 2/2003 | Light et al. |
| 2003/0037036 A1 | 2/2003 | Weare |
| 2003/0041105 A1 | 2/2003 | Patrick |
| 2003/0047683 A1 | 3/2003 | Kaushal |
| 2003/0069077 A1 | 4/2003 | Korienek |
| 2003/0074130 A1 | 4/2003 | Negishi et al. |
| 2003/0076301 A1 | 4/2003 | Tsuk et al. |
| 2003/0080992 A1 | 5/2003 | Haines |
| 2003/0089218 A1 | 5/2003 | Gang et al. |
| 2003/0097659 A1 | 5/2003 | Goldman |
| 2003/0110038 A1 | 6/2003 | Sharma et al. |
| 2003/0115193 A1 | 6/2003 | Okamoto et al. |
| 2003/0135490 A1 | 7/2003 | Barrett et al. |
| 2003/0187837 A1 | 10/2003 | Culliss |
| 2003/0193572 A1 | 10/2003 | Wilson et al. |
| 2003/0195884 A1 | 10/2003 | Boyd et al. |
| 2003/0217007 A1 | 11/2003 | Fukushima et al. |
| 2003/0220917 A1 | 11/2003 | Copperman et al. |
| 2003/0221541 A1 | 12/2003 | Platt |
| 2003/0227478 A1 | 12/2003 | Chatfield |
| 2003/0236582 A1 | 12/2003 | Zamir et al. |
| 2003/0236843 A1 | 12/2003 | Weber et al. |
| 2004/0006711 A1 | 1/2004 | Krishnaswamy et al. |
| 2004/0015714 A1 | 1/2004 | Abraham et al. |
| 2004/0017482 A1 | 1/2004 | Weitman |
| 2004/0019588 A1 | 1/2004 | Doganata et al. |
| 2004/0044911 A1 | 3/2004 | Takada et al. |
| 2004/0059708 A1 | 3/2004 | Dean et al. |
| 2004/0068486 A1 | 4/2004 | Chidlovskii |
| 2004/0097806 A1 | 5/2004 | Hunter et al. |
| 2004/0103087 A1 | 5/2004 | Mukherjee et al. |
| 2004/0117306 A1 | 6/2004 | Karaoguz et al. |
| 2004/0124248 A1 | 7/2004 | Selker |
| 2004/0125073 A1 | 7/2004 | Potter et al. |
| 2004/0164971 A1 | 8/2004 | Hayward et al. |
| 2004/0166937 A1 | 8/2004 | Rothschild et al. |
| 2004/0176134 A1 | 9/2004 | Goldthwaite et al. |

(56) References Cited

U.S. PATENT DOCUMENTS

| | | |
|---|---|---|
| 2004/0179694 A1 | 9/2004 | Alley |
| 2004/0186824 A1 | 9/2004 | Delic et al. |
| 2004/0203633 A1 | 10/2004 | Knauerhase et al. |
| 2004/0203901 A1 | 10/2004 | Wilson et al. |
| 2004/0204240 A1 | 10/2004 | Barney |
| 2004/0213420 A1* | 10/2004 | Gundry ............... H03G 7/004 381/104 |
| 2004/0215469 A1 | 10/2004 | Fukushima et al. |
| 2004/0218768 A1* | 11/2004 | Zhurin ................. H03G 3/32 381/107 |
| 2004/0224638 A1 | 11/2004 | Fadell et al. |
| 2004/0225519 A1 | 11/2004 | Martin |
| 2004/0225635 A1 | 11/2004 | Toyama et al. |
| 2004/0252397 A1 | 12/2004 | Hodge et al. |
| 2004/0254717 A1 | 12/2004 | Sugahara et al. |
| 2005/0003831 A1 | 1/2005 | Anderson |
| 2005/0021470 A1 | 1/2005 | Martin et al. |
| 2005/0032528 A1 | 2/2005 | Dowling et al. |
| 2005/0038819 A1 | 2/2005 | Hicken et al. |
| 2005/0039206 A1 | 2/2005 | Opdycke |
| 2005/0049113 A1 | 3/2005 | Yueh et al. |
| 2005/0060299 A1 | 3/2005 | Filley et al. |
| 2005/0065976 A1 | 3/2005 | Holm et al. |
| 2005/0071328 A1 | 3/2005 | Lawrence |
| 2005/0080786 A1 | 4/2005 | Fish et al. |
| 2005/0088318 A1 | 4/2005 | Liu et al. |
| 2005/0096047 A1 | 5/2005 | Haberman et al. |
| 2005/0107218 A1 | 5/2005 | Chuang et al. |
| 2005/0107688 A1 | 5/2005 | Strommer |
| 2005/0114149 A1 | 5/2005 | Rodriguez et al. |
| 2005/0126370 A1 | 6/2005 | Takai et al. |
| 2005/0129253 A1 | 6/2005 | Chen |
| 2005/0130802 A1 | 6/2005 | Kinnunen et al. |
| 2005/0139660 A1 | 6/2005 | Maxymych et al. |
| 2005/0143173 A1 | 6/2005 | Barney et al. |
| 2005/0149213 A1 | 7/2005 | Guzak et al. |
| 2005/0149499 A1 | 7/2005 | Franz et al. |
| 2005/0154636 A1 | 7/2005 | Hildinger et al. |
| 2005/0154761 A1 | 7/2005 | Lee et al. |
| 2005/0174975 A1 | 8/2005 | Mgrdechian et al. |
| 2005/0177614 A1 | 8/2005 | Bourne |
| 2005/0197237 A1 | 9/2005 | Chen |
| 2005/0197961 A1 | 9/2005 | Miller et al. |
| 2005/0210419 A1 | 9/2005 | Kela et al. |
| 2005/0212749 A1 | 9/2005 | Marvit et al. |
| 2005/0213771 A1* | 9/2005 | Smaragdis ............. H04R 23/00 381/56 |
| 2005/0222981 A1 | 10/2005 | Lawrence et al. |
| 2005/0222989 A1 | 10/2005 | Haveliwala et al. |
| 2005/0223002 A1 | 10/2005 | Agarwal et al. |
| 2005/0227712 A1 | 10/2005 | Estevez et al. |
| 2005/0233859 A1 | 10/2005 | Takai et al. |
| 2005/0233861 A1 | 10/2005 | Hickman et al. |
| 2005/0251576 A1 | 11/2005 | Weel |
| 2005/0266961 A1 | 12/2005 | Shum et al. |
| 2005/0272445 A1 | 12/2005 | Zellner |
| 2005/0278317 A1 | 12/2005 | Gross et al. |
| 2005/0286546 A1 | 12/2005 | Bassoli et al. |
| 2005/0288954 A1 | 12/2005 | McCarthy et al. |
| 2006/0008256 A1 | 1/2006 | Khedouri et al. |
| 2006/0017692 A1 | 1/2006 | Wehrenberg et al. |
| 2006/0019724 A1 | 1/2006 | Bahl et al. |
| 2006/0020177 A1 | 1/2006 | Seo et al. |
| 2006/0022955 A1 | 2/2006 | Kennedy |
| 2006/0026521 A1 | 2/2006 | Hotelling et al. |
| 2006/0032363 A1 | 2/2006 | Platt |
| 2006/0060068 A1 | 3/2006 | Hwang et al. |
| 2006/0084551 A1 | 4/2006 | Volpe, Jr. et al. |
| 2006/0095331 A1 | 5/2006 | O'Malley et al. |
| 2006/0095412 A1 | 5/2006 | Zito et al. |
| 2006/0095516 A1 | 5/2006 | Wijeratne |
| 2006/0097991 A1 | 5/2006 | Hotelling et al. |
| 2006/0098772 A1 | 5/2006 | Reho et al. |
| 2006/0101377 A1 | 5/2006 | Toyama et al. |
| 2006/0107822 A1 | 5/2006 | Bowen |
| 2006/0111621 A1 | 5/2006 | Coppi et al. |
| 2006/0123080 A1 | 6/2006 | Baudino et al. |
| 2006/0136173 A1 | 6/2006 | Case, Jr. et al. |
| 2006/0161621 A1 | 7/2006 | Rosenberg |
| 2006/0167576 A1 | 7/2006 | Rosenberg |
| 2006/0167943 A1 | 7/2006 | Rosenberg |
| 2006/0169125 A1 | 8/2006 | Ashkenazi et al. |
| 2006/0173828 A1 | 8/2006 | Rosenberg |
| 2006/0173837 A1 | 8/2006 | Berstis et al. |
| 2006/0188109 A1 | 8/2006 | Makino et al. |
| 2006/0189386 A1 | 8/2006 | Rosenberg |
| 2006/0195361 A1 | 8/2006 | Rosenberg |
| 2006/0229163 A1 | 10/2006 | Waters |
| 2006/0243120 A1 | 11/2006 | Takai et al. |
| 2006/0253210 A1 | 11/2006 | Rosenberg |
| 2006/0276919 A1 | 12/2006 | Shirai et al. |
| 2006/0288846 A1 | 12/2006 | Logan |
| 2007/0021269 A1 | 1/2007 | Shum |
| 2007/0044641 A1 | 3/2007 | McKinney et al. |
| 2007/0060446 A1 | 3/2007 | Asukai et al. |
| 2007/0067294 A1 | 3/2007 | Ward et al. |
| 2007/0074618 A1 | 4/2007 | Vergo |
| 2007/0074619 A1 | 4/2007 | Vergo |
| 2007/0083323 A1 | 4/2007 | Rosenberg |
| 2007/0113725 A1 | 5/2007 | Oliver et al. |
| 2007/0125852 A1 | 6/2007 | Rosenberg |
| 2007/0135264 A1 | 6/2007 | Rosenberg |
| 2007/0156676 A1 | 7/2007 | Rosenberg |
| 2007/0156677 A1 | 7/2007 | Szabo |
| 2007/0161382 A1 | 7/2007 | Melinger et al. |
| 2007/0162341 A1 | 7/2007 | McConnell et al. |
| 2007/0173377 A1 | 7/2007 | Jamsen et al. |
| 2007/0271228 A1 | 11/2007 | Querel |
| 2008/0005075 A1 | 1/2008 | Horvitz et al. |
| 2008/0016040 A1 | 1/2008 | Jones et al. |
| 2008/0016218 A1 | 1/2008 | Jones et al. |
| 2008/0045140 A1 | 2/2008 | Korhonen et al. |
| 2008/0077261 A1 | 3/2008 | Baudino et al. |
| 2008/0082510 A1 | 4/2008 | Wang et al. |
| 2011/0009051 A1 | 1/2011 | Khedouri et al. |
| 2012/0087516 A1* | 4/2012 | Amin .................... H03G 3/32 381/107 |
| 2012/0200395 A1 | 8/2012 | Twitchell |

FOREIGN PATENT DOCUMENTS

| | | |
|---|---|---|
| WO | 02/073818 | 9/2002 |
| WO | 2006/086439 | 8/2006 |

OTHER PUBLICATIONS

Abrial et al., "A New Contactless Smartcard IC Using an On-Chip Antenna and an Asynchronous Micro-controller", 2001.

Anonymous, "Social Search", Wikipedia.com, Jan. 23, 2008.

Apple Computer/Nike, "Tune Your Run", downloaded from www.apple.com on Jun. 28, 2006.

BAI Aerosystems, "Unmanned Aircraft Systems", www.baiaerosystems.com, 1985.

Betlyon, "Omni Fitness Equipment Stores Integrate Physical Genius Online Fitness Tools", downloaded from www.physicalgenius.com on Aug. 5, 2007, Apr. 19, 2000.

BPM List, "Beat rates per minute", downloaded from www.bpmlist.com on Jun. 27, 2006. Lulu Publishing. ISBN 1-4116-4211-2.

Brin et al., "The Anatomy of a Large-Scale Hypertextual Search Engine", Stanford University, 1998.

Casey, "MPEG-7 Sound-Recognition Tools", IEEE Transactions on Circuits and Systems for Video Technology, vol. 11, No. 6, Jun. 2001.

Castelli et al., "Habitat Telemonitoring System Based on the Sound Surveillance".

Castrillon et al., "Identity and Gender Recognition Using the ENCARA Real-Time Face Detector", CAEPIA, Nov. 2003.

Childers et al., "Gender Recognition from Speech Part I: Coarse Analysis", 1991.

Childers et al., "Gender Recognition from Speech Part II: Fine Analysis", 1991.

(56) References Cited

OTHER PUBLICATIONS

Ciger et al., "The magic wand", In: Proceedings of Spring Conference on Computer Graphics 2003, Budmerice, Slovak Republic, 132-8., 2003.
Cook et al., "Using DSP-Based Parametric Physical Syntheses Models to Study Human Sound Perception", IEEE Workshop on Applications of Signal Processing to Audio and Acoustics., 2003.
DeMartini, "Cyber Fitness", downloaded from www.physicalmag.com/articlesTemp.as?dept=14articleID=1812 on Jul. 10, 2007, Feb. 18, 2001.
Dialogr, "Post Thought", http://www.dialogr.com/PostThought.cfm?TopicId=684, May 22, 2007.
Finkelstein, "Placing Search in Context: The Concept Revisted", Zapper Technologies, May 5, 2001.
FitLinxx, "www.fitlinxx.com", downloaded from www.fitlinxx.com/brand/about.sub.--tour3.htm on Jul. 9, 2007 2003.
GestureTek, "www.gesturetek.com", Jul. 1996.
Gordon et al., "Silicon Optical Navigation", 2003.
Hayashi et al., "A Method for Estimating and Modeling Age and Gender Using Facial Image Processing", 2001.
Hernandez et al., "A Multi-Class Pattern Recognition System for Practical Finger Spelling Translation", Proceedings of International Conference on Multimodal Interfaces, IEEE, 185-190., 2002.
Hernandez et al., "A New Instrumented Approach for Translating American Sign Language Into Sound and Text", IEEE International Conference on Face and Gesture Recognition 2004, Seoul, Korea, May 2004.
Human Metrics, "Jung Typology Test", available at: http://www.humanmetrics.com/cgi-win/JTypes2.asp last visited Jun. 15, 2007.
Kawahara et al., "Designing a Universal Remote Control for the Ubiquitous Computing Environment", EE Times, 2003.
Kornbluh et al., "High-field Electrostriction of Elastomeric Polymer Dielectrics for Actuation", SPIE Conference on Electroactive Polymer Actuators and Devices, Mar. 1999.
Kramer et al., "The Talking Glove: Expressive and Receptive Verbal Communication Aid for the Deaf, Deaf-Blind, and Nonvocal", SIGCAPH 39, 12-15., Spring 1988.
Lumia et al., "Microgripper design using electo-active polymers", SPIE Conference on Electroactive Polymer Actuators and Devices, SPEE vol. 3669, Mar. 1999.
Martin, "Sound-Source Recognition: A Theory and Computational Model", doctoral dissertation from MIT, 1999.
McKinney et al., "Deviations from the resonance theory of tempo induction", published at the Conference on Interdisciplinary Musicology, 2004.
McKinney et al., "Extracting the Perceptual Tempo from Music", published at the ISMIR 2004 5th International Conference on Music Information Retrieval, 2004.
Metzger et al., "FreeDigiter: A Contact-free Device for Gesture Control", IEEE 8th International Symposium on Wearable Computers, Nov. 4, 2004.
Morhring et al., "Video See-Through AR on Consumer Cell-Phones", Mar. 2004.
Munro, "eNewsChannels", downloaded from enewschannels.com/20070106enc582-025321.php on Aug. 5, 2007, Jul. 1, 2007.
Murray et al., "Underwater Teleroboticsa and Virtual Reality: A New Partnership", NCCOSC RDT and E Division; pp. 1-10; San Diego, CA, 1-10, Jun. 20, 1996.
Nintendo, "Kirby's Tilt N' Tumble", downloaded from www.nintendo.com, 2 pages, Nov. 14, 2006.
Oguro et al., "Polymer Electrolyte Actuator with Gold Electrodes", SPIE Conference on Electroactive Polymer Actuators and Devices, SPEE vol. 3669, 1999.
Oliver et al., "Enhancing Exercise Performance through Real-time Phsiological Monitoring and Music: A User Study", Proceedings of Pervasive Health 2006. Innsbruck, Austria., Nov. 2006.
Reactrix, "www.reactrix.com", 2002.
Reinhold, "Applications of Myers-Briggs Type Indicator, Personality Type", available at http://www.personalitypathways.com/. Last visited: Jun. 15, 2007.
Roper Resources, "Remotely Operated Vehicles Seaeye Falcon", www.roperresources.com, May 2002.
Rosenberg, "A force Feedback Programming Primer", Immersion Corporation, 1997.
Rosenberg, "Virtual Fixtures: perceptual Overlays Enchance Operator Performance in Telepresence Tasks", Ph.D. Dissertation, Stanford University, Jun. 1994.
Schotz, "Automatic prediction of speaker age using CART", 2003.
Seabotix, "Remotely Operated Vehicle", www.seabotix.com/products/lbv150.htm, Dec. 2001.
Shahinpoor, ",Electro-mechanics of ionoelastic beams as electrically-controllable artificial muscles", SPIE Conference on Electroactive Polymer Actuators and Devices, SPEE vol. 3669, 1999.
Sharper Image, "Laser Baseball", Item #PS115; downloaded from www.sharperimage.com on Dec. 9, 2005, 18 pages, Dec. 9, 2005.
Spohrer, "Information in Places", IBM Systems Journal; pp. 602-628; vol. 38, No. 4., 1999.
Sullivan, "Eurekster Launches Personalized Social Search", SearchEngineWatch.com Online Newsletter, Jan. 24, 2004.
The Degree Confluence Project, www.confluence.org, first visited May 2005.
Total Immersion, "D'Fusion Software", 2004.
Ubergizmo, "Bodybug Calorie Management System", downloaded from www.ubergizmo.com/15/archives/2005/03/boddybug.sub.-calori.html on Jul. 9, 2007, Mar. 18, 2005.
USPTO, "Examiner Interview", for U.S. Appl. No. 11/285,534 mailed Nov. 19, 2008.
USPTO, "Examiner Interview Summary", from U.S. Appl. No. 11/267,079 mailed Feb. 24, 2009.
USPTO, "Examiner Interview Summary", from U.S. Appl. No. 11/315,762 mailed Feb. 25, 2009.
USPTO, "Non Final Office Action", for U.S. Appl. No. 11/744,879 mailed Mar. 1, 2011.
USPTO, "Non Final Office Action", from U.S. Appl. No. 11/223,368 mailed Dec. 24, 2008.
USPTO, "Non Final Office Action", from U.S. Appl. No. 11/428,341 mailed Apr. 27, 2009.
USPTO, "Non Final Office Action", from U.S. Appl. No. 11/610,494 mailed Jan. 26, 2009.
USPTO, "Non Final Office Action", from U.S. Appl. No. 11/619,605 mailed Apr. 1, 2009.
USPTO, "Non Final Office Action", from U.S. Appl. No. 11/676,298 mailed Dec. 8, 2010.
USPTO, "Non Final Office Action", from U.S. Appl. No. 11/749,130 mailed Oct. 5, 2009.
USPTO, "Non-Final Office Action", from U.S. Appl. No. 11/563,610 mailed Feb. 3, 2010.
USPTO, "Non-Final Office Action", from U.S. Appl. No. 11/772,803 mailed Aug. 11, 2010.
USPTO, "Notice of Allowance", for U.S. Appl. No. 11/285,534 mailed Nov. 19, 2008.
USPTO, "Notice of Allowance", from U.S. Appl. No. 11/267,079 mailed Feb. 24, 2009.
USPTO, "Notice of Allowance", from U.S. Appl. No. 11/427,325 mailed Jan. 26, 2009.
USPTO, "Notice of Allowance", from U.S. Appl. No. 11/533,037 mailed Apr. 30, 2009.
USPTO, "Notice of Allowance", from U.S. Appl. No. 11/539,598 mailed Jun. 29, 2009.
USPTO, "Office Action", from U.S. Appl. No. 11/246,050 mailed Jul. 9, 2008.
USPTO, "Office Action", from U.S. Appl. No. 11/267,079 mailed Jul. 17, 2008.
USPTO, "Office Action", from U.S. Appl. No. 11/282,379 dated Sep. 18, 2007.
USPTO, "Office Action", from U.S. Appl. No. 11/282,379 mailed May 30, 2008.
USPTO, "Office Action", from U.S. Appl. No. 11/282,379, filed Sep. 18, 2007.
USPTO, "Office Action", from U.S. Appl. No. 11/285,534 mailed Jul. 21, 2008.

(56) References Cited

OTHER PUBLICATIONS

USPTO, "Office Action", from U.S. Appl. No. 11/298,797 dated Jan. 9, 2008.
USPTO, "Office Action", from U.S. Appl. No. 11/298,797 mailed Jun. 25, 2008.
USPTO, "Office Action", from U.S. Appl. No. 11/298,797, filed Jan. 9, 2008.
USPTO, "Office Action", from U.S. Appl. No. 11/315,762 dated Jan. 29, 2008.
USPTO, "Office Action", from U.S. Appl. No. 11/315,762 mailed Aug. 12, 2008.
USPTO, "Office Action", from U.S. Appl. No. 11/341,021 dated Jan. 18, 2008.
USPTO, "Office Action", from U.S. Appl. No. 11/344,612 dated Apr. 8, 2008.
USPTO, "Office Action", from U.S. Appl. No. 11/344,701 dated Jan. 24, 2008.
USPTO, "Office Action", from U.S. Appl. No. 11/383,195 dated Mar. 19, 2008.
USPTO, "Office Action", from U.S. Appl. No. 11/422,065 dated Jan. 28, 2008.
USPTO, "Office Action", from U.S. Appl. No. 11/422,065 dated Mar. 28, 2007.
USPTO, "Office Action", from U.S. Appl. No. 11/422,065 dated Aug. 31, 2007.
USPTO, "Office Action", from U.S. Appl. No. 11/422,065, filed Aug. 31, 2007.
USPTO, "Office Action", from U.S. Appl. No. 11/422,065, filed Mar. 28, 2007.
USPTO, "Office Action", from U.S. Appl. No. 11/427,320 mailed Jul. 23, 2008.
USPTO, "Office Action", from U.S. Appl. No. 11/618,858 mailed Jul. 9, 2008.
USPTO, "Restriction Requirement", for U.S. Appl. No. 11/744,879 mailed Nov. 10, 2010.
Visiosonic, "PCDJ Red Virtual Rack Module", Clearwater, FL. Downloaded from www.visiosonic.com on Jun. 27, 2006.
Whittle, "Jukebox Without Quarters", Business Opportunities Weblog, http://www.business-opportunities.bix/2007/03/30/jukebox-without-quarters/, Mar. 30, 2007.
WWMX, "www.wwmx.org", First visited in May 2005.
Yahoo, "Yahoo media player", downloaded from www.yahoo.com on Sep. 19, 2006.
YMCA, "YMCA", downloaded from www.ymcamidpen.org/textpage.php?b=2p=fitlinxx on Jul. 10, 2007 2003.

\* cited by examiner

FIG. 1

FIGURE 2: Flow Chart of Program Flow

AMBIENT SOUND RESPONSIVE MEDIA PLAYER

This application is a continuation-in-part of U.S. patent application Ser. No. 11/267,079 filed Nov. 3, 2005, which claims the benefit of U.S. Provisional Patent Application No. 60/665,291 filed Mar. 26, 2005 and U.S. Provisional Application No. 60/648,197 filed Jan. 27, 2005, all of which are incorporated in their entirety herein by reference.

This application is also a continuation-in-part of U.S. patent application Ser. No. 11/223,368 filed Sep. 9, 2005, which claims the benefit of U.S. Provisional Patent Application No. 60/644,417 filed Jan. 15, 2005, both of which are incorporated in their entirety herein by reference.

This application is also a continuation-in-part of U.S. patent application Ser. No. 11/610,615 filed Dec. 14, 2006, which claims the benefit of U.S. Provisional Patent Application No. 60/793,214 filed Apr. 19, 2006, both of which are incorporated in their entirety herein by reference.

This application also claims the benefit of U.S. Provisional Patent Application No. 60/841,990 filed Aug. 31, 2006, which is incorporated in its entirety herein by reference.

BACKGROUND OF THE INVENTION

1. Field of the Invention

The present invention relates generally to media players, and more specifically to responsive media players.

2. Discussion of the Related Art

Portable media players have become popular personal entertainment devices due to their highly portable nature, their ability to provide accessibility to a large library of stored media files, and interconnectivity with existing computer networks, for example the Internet. The accessibility and simplicity in downloading music and other electronic media continues to fuel the popularity of these devices as is exemplified by Apple Computer, Inc.'s highly successful iPod™ portable media player. Other manufacturers have competing Media Players offering various functionalities and file playing compatibilities in an effort to differentiate their products in the marketplace.

As discussed in U.S. Patent Application No, 2004/02241638 A1, which is herein incorporated by reference in its entirety; an increasing number of consumer products are incorporating circuitry to play musical media files and other electronic media. For example, many portable electronic devices such as cellular telephones and personal digital assistants (PDAs) include the ability to play electronic musical media in many of the most commonly available file formats including MP3, AVI, WAV, MPG, QT, WMA, AIFF, AU, RAM, RA, MOV, MIDI, etc. With a wide variety of devices and file formats emerging, it is expected that in the near future a large segment of the population will have upon their person an electronic device with the ability to access music files from a library of media files in local memory and/or over a computer network, and play those music files at will. Such users generally wear headphones to experience music content in a personalized high fidelity manner.

Because most users of portable media players generally wear headphones to play music directly into their ears, users experience the beneficial effect of separating themselves from the noises of daily life, providing a serene audio environment of personally played music. Unfortunately, users often miss important sound events within the real world when listening to music through headphones of a portable media player. For example, another person might be talking to the media player user but because of the music playing through their headphones, the user is unable to hear the fact that they have been verbally addressed. Similarly, a siren or alarm may sound in the environment of a headphone-wearing media player user, but they may not hear the warning sound effectively, thus creating a dangerous situation for the user. Finally, a headphone-wearing media player user may try to talk to someone else within their immediate environment, but because they cannot hear their own voice, they may find themselves talking substantially too loud for the current situation. This may create an embarrassing situation for the user.

SUMMARY OF THE INVENTION

Several embodiments of the invention advantageously address the needs above as well as other needs by providing a media player that is responsive to ambient sound.

In some embodiments, the invention can be characterized as a method of adjusting an output of a media player comprising capturing an ambient audio signal; processing the ambient audio signal to determine whether one or more characteristic forms are present within the ambient audio signal; and reducing an output of a media player from a first volume to a second volume if the one or more characteristic forms are present within the ambient audio signal.

In some embodiments, the invention can be characterized as a method of adjusting an output of a media player comprising capturing an ambient audio signal; processing the ambient audio signal to determine whether one or more characteristic forms are present within the ambient audio signal; and mixing at least a portion of the ambient audio signal with a first output of a media player to generate a second output of the media player if the one or more characteristic forms are present within the ambient audio signal.

In some embodiments, the invention can be characterized as a An apparatus for use in a media player comprising a microphone; and one or more processors adapted to: process an ambient audio signal received by the microphone to determine whether one or more characteristic forms are present within the ambient audio signal, and adjust an output of a media player if the one or more characteristic forms are present within the ambient audio signal.

BRIEF DESCRIPTION OF THE DRAWINGS

The above and other aspects, features and advantages of several embodiments of the present invention will, be more apparent from the following more particular description thereof, presented in conjunction with the following drawings.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

The following description is not to be taken in a limiting sense, but is made merely for the purpose of describing the general principles of exemplary embodiments. The scope of the invention should be determined with reference to the claims.

There currently exists a need to provide intelligent volume control of media content play through headphones (or other similar headsets and ear pieces), such that a headphone wearing media player user may more easily hear when he or she is verbally addressed, when an alarm or siren sounds within his or her environment, and/or when he or she is speaking aloud.

This disclosure addresses the deficiencies of the relevant art and provides exemplary systematic, methodic and computer program product embodiments which provides an ambient sound responsive portable media player that enables a media player to intelligently adjust and/or vary the playing volume of a musical media file to a user based at least in part upon detected sounds from the ambient environment of the user. More specifically, the present invention provides an ambient sound responsive media player in which the musical sounds played to a user through the headphones of a media player are moderated based at least in part upon detected ambient sounds from within the user's local environment. The system works by incorporating a microphone in the media player system, the microphone configured to detect sounds from the ambient environment of the media player user as the user listens to music through headphones. The system further includes a processor for making volume adjustments to playing media content based at least in part upon detected ambient audio signals from said microphone. The processor of the present invention may be configured through hardware and software components to perform one or more of the following functions:

(A) Name Responsive Volume Reduction.

This is a function in which the playing volume of currently playing media file is automatically reduced by the processor for a period of time in response to the media players user's name being detected as verbal content within the audio signal captured from the ambient environment. In this way if another person calls the user's name, presumably to talk to that user, the media player is responsive to automatically reduce the playing volume of media content to that user, (B) User Voice Responsive Volume Reduction.

This is a function in which the playing volume of a currently playing media file is automatically reduced by the processor for a period of time in response to the media players user's own voice being detected within the audio signal captured from the ambient environment. In this way if the media player user begins speaking aloud into the ambient environment, the media player is automatically responsive by reducing the playing volume of media content to that user so the user can more easily hear himself talk. This prevents the user from speaking too loudly into the ambient environment and embarrassing himself.

(C) Alarm sound volume reduction. This is a function in which the playing volume of currently playing media file is automatically reduced by the processor for a period of time in response to an alarm sound or siren sound being detected as within the audio signal captured from the ambient environment. In this way if an alarm or siren sounds within the user's local environment, presumably because there is a danger to be alerted to, the media player is responsive to automatically reduce the playing volume of media content to that user. In this way the user will more easily hear the alarm sound.

In some embodiments of the present invention, the media player is operative to mix musical audio content derived from a stored media file with ambient audio content captured from a microphone local to the user. In this way the user can listen to musical media content in audio combination with ambient audio signals from the local environment. While such a function may enable a user to more easily hear sounds such as other speaking users, the user's own voice, and/or alarms and sirens, such a mixed audio signal may be unpleasant during times when such events are not occurring. Thus some embodiments of the present invention include an inventive method in which the relative volume balance of the mixed signal (i.e. the relative volume of the musical media content and the ambient microphone content) are selectively adjusted in response to detected ambient audio events. More specifically, the relative volume of the microphone content is automatically increased with respect to the musical media content within the mixed audio signal in response to detected ambient audio events such as (A) detection of the media player's name being uttered within the ambient audio signal, (B) detection of the media player's own voice within the ambient audio signal, and/or (C) detection of an alarm or siren sound present within the ambient audio signal.

The present invention provides a system, method and computer program product which enables a media player to intelligently adjust and/or vary the playing volume of a musical media file to a user based at least in part upon detected sounds from the ambient environment of the user. More specifically, the present invention provides an ambient sound responsive media player in which the musical sounds played to a user through the headphones of a media player are moderated based at least in part upon detected ambient sounds from within the user's local environment. In some embodiments ambient sounds from the local environment are selectively mixed with digital media sounds such that their relative volumes are adjusted based at least in part upon detected ambient sound events within the user's local environment. Where necessary, computer programs, routines and algorithms are envisioned to be programmed in a high level language, for example Java™ C++, C, C#, or Visual Basic™.

Figure 1:
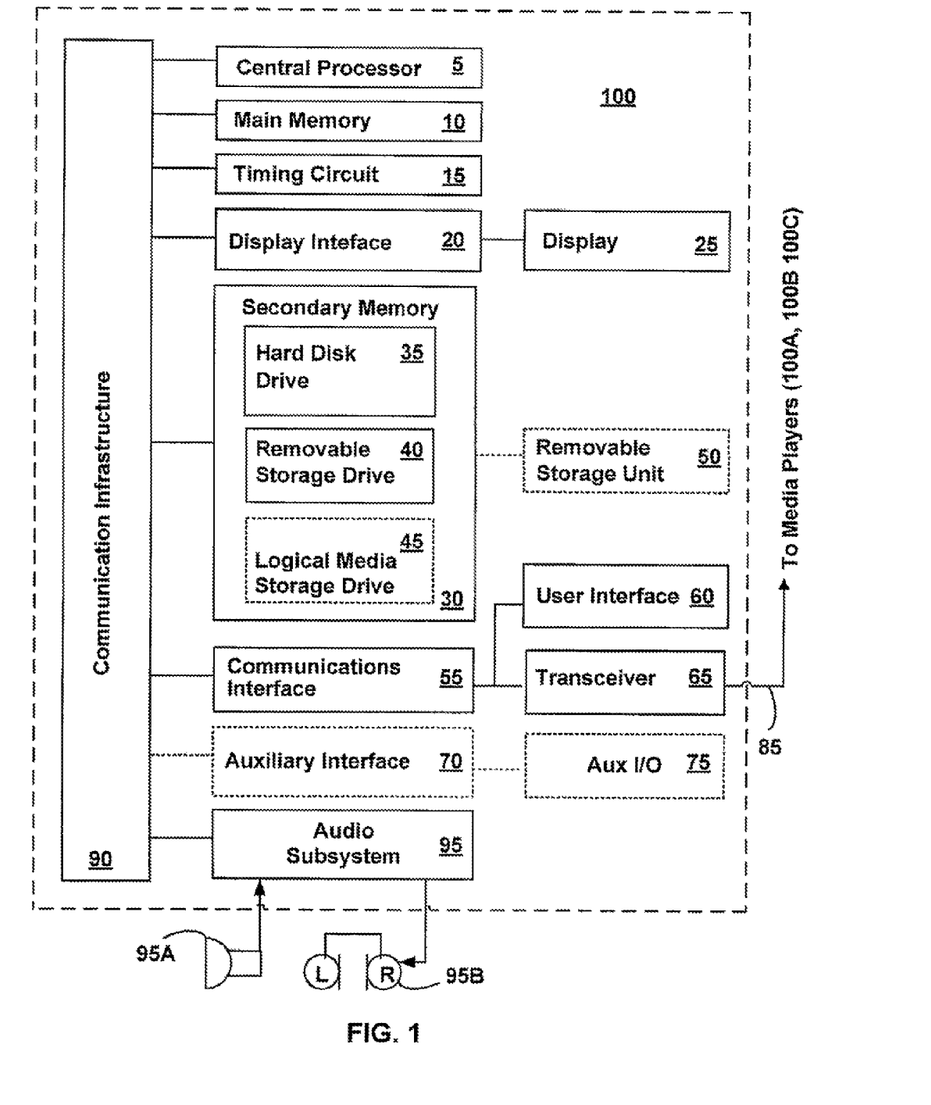
FIG. 1 depicts a generalized block diagram of a media player in accordance with some embodiments of the present invention.

Referring to FIG. 1, a generalized block diagram of a media player 100 is depicted. The media player 100 includes a communications infrastructure 90 used to transfer data, memory addresses where data items are to be found and control signals among the various components and subsystems of the media player 100.

A central processor 5 is provided to interpret and execute logical instructions stored in the main memory 10. The main memory 10 is the primary general purpose storage area for instructions and data to be processed by the central processor 5. The main memory 10 is used, in its broadest sense and includes RAM, EEPROM and ROM. A timing circuit 15 is provided to coordinate activities within the media player 100. The central processor 5, main memory 10 and timing circuit 15 are directly coupled to the communications infrastructure 90.

A display interface 20 is provided to drive a display 25 associated with the media player 100. The display interface 20 is electrically coupled to the communications infrastructure 90 and provides signals to the display 25 for visually outputting both graphics and alphanumeric characters. The display interface 20 may include a dedicated graphics processor and memory to support the displaying of graphics intensive media. The display 25 may be of any type (e.g., cathode ray tube, gas plasma) but in most circumstances will usually be a solid state device such as liquid crystal display.

A secondary memory subsystem 30 is provided which houses retrievable storage units such as a hard disk drive 35, a removable storage drive 40, an optional a logical media storage drive 45 and an optional removal storage unit 50.

The removable storage drive 40 may be a replaceable hard drive, optical media storage drive or a solid state flash RAM device. The logical media storage drive 45 may be flash RAM device, EEPROM encoded with playable media, or optical storage media (CD, DVD). The removable storage unit 50 may be logical, optical or of an electromechanical (hard disk) design.

A communications interface 55 subsystem is provided which allows for standardized electrical connection of peripheral devices to the communications infrastructure 90 including, serial, parallel, USB, and Firewire connectivity. For example, a user interface 60 and a transceiver 65 are electrically coupled to the communications infrastructure 90 via the communications interface 55. For purposes of this disclosure, the term user interface 60 includes the hardware and operating software by which a user executes procedures on the media player 100 and the means by which the media player conveys information to the user.

The user interface 60 employed on the media play 100 includes a pointing device (not shown) such as a mouse, thumbwheel or track ball, an optional touch screen (not shown); one or more pushbuttons (not shown); one or more sliding or circular rheostat controls (not shown), one or more switches (not shown), and one or more tactile feedback units (not shown); One skilled in the relevant art will appreciate that the user interface devices which are not shown are well known and understood.

To accommodate non-standardized communications interfaces (i.e., proprietary), an optional separate auxiliary interface 70 and auxiliary I/O port 75 are provided to couple proprietary peripheral devices to the communications infrastructure 90.

The transceiver 65 facilitates the remote exchange of data and synchronizing signals between and among the various media players 100A, 100B, 100C in processing communications with 85 with this media player 100.

The transceiver 65 is envisioned to be of a radio frequency type normally associated with computer networks for example, wireless computer networks based on BlueTooth™ or the various IEEE standards 802.11.sub.x., where x denotes the various present and evolving wireless computing standards.

Alternately, digital cellular communications formats compatible with for example GSM, 3G and evolving cellular communications standards. Both peer-to-peer (PPP) and client-server models are envisioned for implementation of the invention. In a third alternative embodiment, the transceiver 65 may include hybrids of computer communications standards, cellular standards and evolving satellite radio standards.

Lastly, an audio subsystem 95 is provided and electrically coupled to the communications infrastructure 90. The audio subsystem is configured for the playback and recording of digital media, for example, multi or multimedia encoded in any of the exemplary formats MP3, AVI, WAV, MPG, QT, WMA, AIFF, AU, RAM, RA, MOV, MIDI, etc.

The audio subsystem includes a microphone 95A which is used for the detection of sound signals from the user's local ambient environment. The microphone 95A may be incorporated within the casing of the portable media player or may be remotely located elsewhere upon the body of the user and is connected to the media player by a wired or wireless link. Ambient sound signals from microphone 95A are generally captured as analog audio signals and converted to digital form by an analog to digital converter or other similar component and/or process. A digital signal is thereby provided to the processor of the media player, the digital signal representing the ambient audio content captured by microphone 95A. In some embodiments the microphone 95A is local to the headphones or other head-worn component of the user. In some embodiments the microphone is interfaced to the media player by a Bluetooth communication link. In some embodiments the microphone comprises a plurality of microphone elements.

The audio subsystem also includes headphones (or other similar personalized audio presentation units that display audio content to the ears of a user) 95B. The headphones may be connected by wired or wireless connections. In some embodiments the headphones are interfaced to the media player by a Bluetooth communication link.

As referred to in this specification, "media items" refers to video, audio, streaming and any combination thereof. In addition, the audio subsystem is envisioned to optionally include features such as graphic equalization, volume, balance, fading, base and treble controls, surround sound emulation, and noise reduction, One skilled in the relevant art will appreciate that the above cited list of file formats is not intended to be all inclusive.

The media player 100 includes an operating system, the necessary hardware and software drivers necessary to fully utilize the devices coupled to the communications infrastructure 90, media playback and recording applications and at least one ambient sound responsive volume adjustment program operatively loaded into main memory 10. Optionally, the media player 100 is envisioned to include at least one remote authentication application, one or more cryptography applications capable of performing symmetric and asymmetric cryptographic functions, and secure messaging software. Optionally, the media player 100 may be disposed in a portable form factor to be carried by a user.

Figure 2:
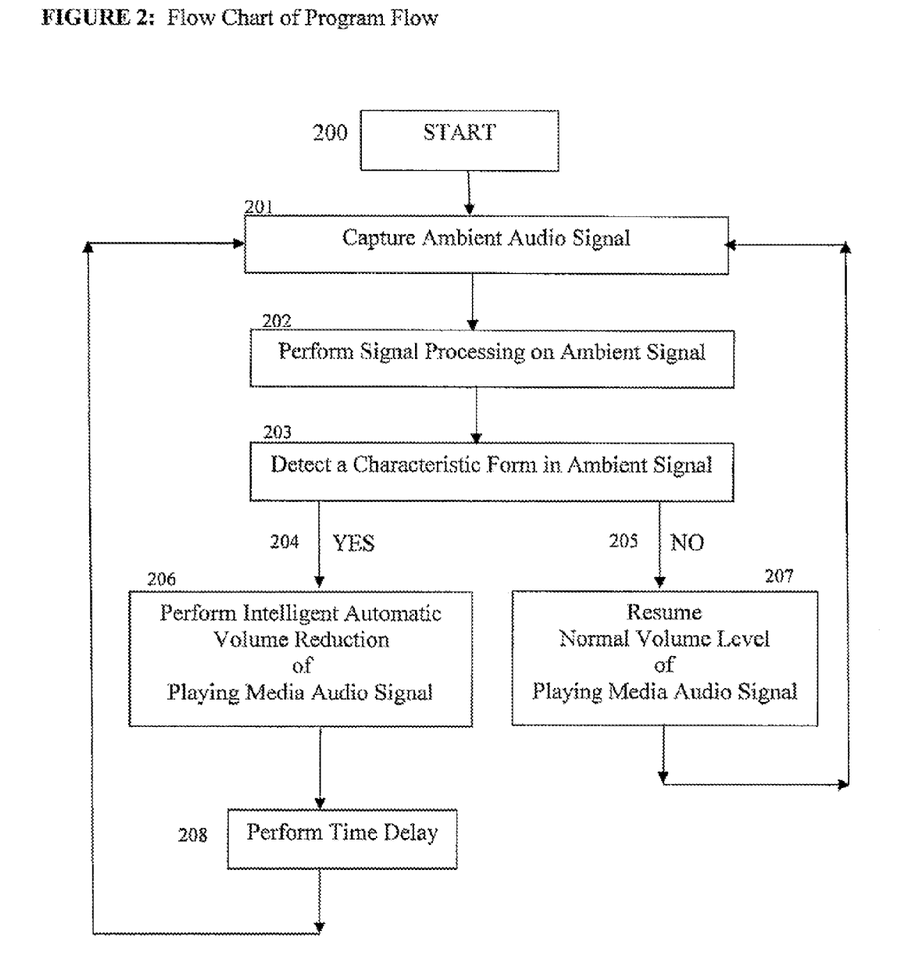
FIG. 2 depicts a flow chart of a process of an ambient sound responsive media player unit in accordance with some embodiments of the present invention.

Referring to FIG. 2, shown is a flow chart of a process of an ambient sound responsive media player unit in accordance with some embodiments of the present invention. The program flow shown would generally be performed in parallel with other processes performed by the media player, including processes that select and/or play media items by accessing media content from memory and outputting an audio representation of such media content through headphones and/or other similar audio presentation hardware. The program flow shown would generally be performed, at least in part, by routines running upon a processor of the portable media player. The program flow shown is generally performed, at leaset in part, by at least a portion of at least one ambient sound responsive volume adjustment program operatively loaded into main memory 10. In the particular embodiment shown herein, the entire program flow shown is performed by the at least one ambient sound responsive volume adjustment program operatively loaded into main memory 10. At the time in which the program flow begins, the media player has already selected and begun to play a media file through a separate process (not shown).

The program flow of FIG. 2 begins at step 200, generally in response to a function call or other programming flow construct. Once started, the program flow performs a continuous loop until terminated. The continuous loop includes a number of steps which may be performed in a variety of orders. In the particular flow shown in FIG. 2, the first step in the continuous loop is step 201 wherein ambient audio signals are captured through microphone 95A. This ambient audio signals are generally captured as analog signals from the microphone element and then are digitized through an analog to digital conversion process. In addition, noise reduction, filtering, and/or other commonly known signal processing steps may be performed upon the ambient signal. The ambient audio signals, once converted to a final digital form, are generally stored in a temporary local memory of the portable media player. It should be noted that this ambient audio signal capture step 201 may be performed by a separate process that runs in parallel with the program flow of FIG. 2. This separate process may, for example, store digitized ambient audio signal into a shared memory space that is accessible by the steps of this program flow.

The process then proceeds to step 202 wherein additional signal processing is performed on the captured ambient signal. This signal processing may include sound recognition processing, speech recognition processing, and/or vocal identity recognition processing steps and/or sub-steps. Because sound recognition, speech recognition, and/or vocal identity recognition processes are known to the prior art the specifics of such processes will not be described in detail herein. For example, U.S. Pat. No. 4,054,749 and U.S. Pat. No. 6,298,323, each of which are hereby incorporated, by reference, both disclose methods and apparatus for voice recognition wherein a particular user's voice may be identified as being present within an audio signal within certain accuracy limits. Similarly, U.S. Pat. No. 6,804,643, which is hereby incorporated by reference, discloses a speech recognition system in which particular verbal utterances may be identified from within an audio signal, the particular verbal utterances including particular words, phrases, names, and other verbal constructs. Similarly, other pieces of art discloses methods and systems by which particular non-verbal sounds may be identified within an ambient sound signal, One example of such sound recognition methods is disclosed in HABITAT TELEMONITORING SYSTEM BASED ON THE SOUND SURVEILLANCE by Castelli, Vacher, Istrate, Besacier, and Serignat which is hereby incorporated by reference, Another example of such sound recognition methods is disclosed in a 1999 doctoral dissertation from MIT by Keith Dana Martin entitled *Sound-Source Recognition: A Theory and Computational Model* which is hereby incorporated by reference. Another example of such sound recognition methods is disclosed by Michael Casey in the IEEE TRANSACTIONS ON CIRCUITS AND SYSTEMS FOR VIDEO TECHNOLOGY, VOL. 11, NO. 6, June 2001 in a paper entitled, MPEG-7 *Sound-Recognition Tools* which is hereby incorporated by reference. In such papers it is explained that recent advances in pattern recognition methodologies make the automatic identification of characteristic environmental sounds, animal sounds, non-verbal human utterances, and other non-verbal environmental sounds possible. Using such techniques, for example, alarm sound and/or siren sounds may be identified from within an ambient audio signal.

Thus by using the prior art methods of speech recognition, voice identity recognition, and environmental sound identification, the ambient sound signal captured by microphone 95A and stored in local memory, may be processed such that (A) the utterance of the media player user's name may be identified if substantially present within the captured ambient audio signal, (B) the unique voice of the media player user may be identified if substantially present within the captured ambient audio signal, and/or (C) the sound of an alarm and/or siren and/or other similar emergency related alert sound may be identified if substantially present within the captured ambient audio signal. To perform such identifications, processing is performed in step 202, Note—in general this step is performed upon a certain time-sample's worth of ambient audio signal during each loop of the program flow. Also in general the time-samples generally proceed as overlapping time windows with each loop of the program flow.

The process then proceeds to step 203 wherein a set of conditional routines are performed based upon whether or not a characteristic form (e.g. a signal conforming to A, B, or C above) is identified as present within the ambient signal, A characteristic form is a sound or signal that when detected by the media player will cause an audible adjustment to the output of the media player such that the user will be enabled to better hear ambient sounds. Thus in step 203, conditional routines are performed based upon whether or not the ambient signal has been identified to contain one or more of (A) an verbal utterance of the media player user's name by another user, (B) a verbal utterance of any kind from the media player user himself or herself, or (C) the non-verbal sound of an alarm and/or siren and/or other similar emergency related alert. If one or more of such characteristic forms are present within the ambient audio signal, the process proceeds along arrow 204 to step 206. If not, the process proceeds along arrow 205 to step 207. These two alternate paths are described, as follows:

In the "yes" branch, the process proceeds along arrow 204 to step 206. At step 206, the routines of the present invention, perform an Intelligent Automatic Volume Reduction routine in which the currently playing media audio signal is automatically reduced in volume so that the user can better hear the ambient sounds around him or her. This reduction in playing volume of the currently playing media audio signal may be performed abruptly. Alternately, the volume reduction may be performed gradually over a period of time. In general the period of time is short, for example 1500 milliseconds. The volume reduction may be reduced by a fixed amount, for example to 65% of the nominal volume level set by the user, or may be reduced by an amount that is dependent upon the volume level of the identified characteristic ambient sound that triggered the reduction. In some embodiments the user may set a configuration parameter that indicates the desired volume reduction level upon the identification of a characteristic ambient sound event. The volume reduction level may be set as a percentage of the nominal volume level at which the user is currently listening. Alternately the volume reduction level may be set to a defined low value on the absolute volume scale of the unit (for example to a value of 2 out of a scale of 10). Once this automatic volume reduction step is complete, the process flows to step 208 which will be described fluffier down. In the "no" branch, the process proceeds along arrow 205 to step 207. At step 207, the routines of the present invention wilt resume the playing volume of the currently playing media content to (or approximately to) the normal (nominal) playing volume, By nominal playing volume, it means the volume it would be playing as if it had not been reduced, previously by the Intelligent Automatic Volume Reduction routines. Thus if the volume had been reduced previously by the Intelligent Automatic Volume Reduction routines of step 206, then step 207 will return the volume substantially to its normal volume level. This may happen abruptly. Alternately the return of the volume to the nominal level may be performed using gradual volume adjustment routine that gradually resumes the volume over a period of time. In some embodiments the period of time is on the order of 1500 to 3000 milliseconds. Such a time period is short enough that the event seems quick to the user, but long enough that it is not jarring. Note, if the volume was already at the nominal level when step 207 is performed, then step 207 does not perform any substantial change in volume level. Once step 207 completes, the process loops back to the beginning, returning to step 201. In this way the routine continues to capture and process a steady stream of ambient audio signals and responds accordingly with volume reduction and/or resumption.

If a characteristic form was identified within the ambient signal in step 203 and the playing volume of the media content was reduced at step 206, the process then proceeds to step 208 wherein a time delay may be optionally performed. The time delay is performed to ensure that the volume reduction lasts for at least some amount of time beyond the identification of the characteristic form within the ambient signal. In general, this amount of time may be set by the user through a configuration process. This amount of time may be, for example, 3 to 6 seconds. In this way if the routines of the present invention, for example, identify that somebody called the name of the media player user, the volume reduction does not just occur for a split second upon the identification, but lasts for a number of seconds thereafter. In this way the user may hear what is being said to him immediately after his or her name was called. In some embodiments the volume reduction lasts indefinitely, or until the user explicitly resumes normal volume by pressing a button or otherwise engaging the user interface upon his or her media player. The process then loops back to step 201, In this way the routine of the present invention are configured to continually capture and process a steady stream of ambient audio signals and responds accordingly with volume reduction and/or resumption. In general the volume reductions linger for some time delay period after each identified characteristic for the ambient signal. In some embodiments the duration of the time delay is dependent upon the type of characteristic form identified. For example, if the characteristic form is an alarm sound, the time delay may not last long beyond the cessation of the alarm sound, presumably because the emergency alert is over. Alternately, if the characteristic form is a vocal call of the user's name by another user, the time delay is set generally long enough to allow the user to hear what else the other user says after the name call.

In a unique embodiment, the time delay is set to last for as long as the user who called the media player user's name continues to speak. This is performed based upon the detected vocal identity of this other user. Thus if a first user calls the name of the media player user and then continues to speak, the routines of the present invention may be configured to perform an automatic volume reduction upon the detection of the name call as uttered by the first user and will maintain the volume reduction for at least as long as the first user's voice continues to be identified without a time-gap of more than some threshold amount of time. The threshold is generally set such that if the first user speaks at a typical speaking pace, the volume reduction will be maintained until the first user finishes talking.

Additional Non-Verbal Ambient Sound Triggers:

As described previously, the routines of the present invention may be configured to trigger the automatic volume reduction of playing media content on a media player in response to the detection of a characteristic non-verbal sound within the local environment such as the sound of an alarm and/or siren and/or other similar emergency alert captured by microphone 95A of the system. In some embodiments of the present invention, the automatic volume reduction routines may be configured such that additional and/or alternate characteristic non-verbal sounds within the ambient environment may be detected and trigger the volume reduction. For example, common household sounds that a user may desire to attend to such as the sound of a doorbell ringing, a telephone ringing, or a baby crying may be employed as characteristic ambient sounds that trigger the automatic volume reduction routines and methods disclosed herein. In this way a user may be wearing a media player within his or her house and if the microphone on the media player captures a characteristic sound that is substantially similar to a doorbell ringing, a phone ringing, or a baby crying, the volume of the playing media content is automatically reduced for a period of time following the detected Characteristic ambient sound event.

System Configuration:

For embodiments of the present invention that trigger a volume reduction period based upon the detection of an utterance of the media player user's name within the ambient environment, the system is generally configured to identify one or more proper nouns that are relationally associated with the user and stored in memory as a digitized sample, an audio template, or some other stored representation that may be used for pattern matching or other speech recognition methods. For example, the user's name was Theodore, he may configure his media player to be responsive to utterances that are substantially similar to the verbal utterance "Theodore" or the verbal utterance "Theo" or the verbal utterance "Teddy" or the verbal utterance "Ted". In this way a single user may configure his or her media player to be volume-reduction responsive to verbal utterances of a plurality of proper nouns, i.e. personal identifiers, that are set in memory to be relationally associated with an automatic volume reduction process of the media player. The user may also configure the unit to be responsive to a first name, last name, and middle name, and/or any combination thereof. The user may also configure the unit to be responsive only to name utterances that exceed a certain volume threshold. In this way the unit may be less likely to get falsely triggered by name calls that may not be meant for the user even if they conform with a characteristic utterance associated with that user, hi addition, the user may set his or her unit to be responsive to utterances that are nick-names or pen-names or user-names or even other words that are not necessarily names. This Theodore in the example above may set his unit to be responsive to the utterance "dog-boy". So long as his friends know to use the utterance "dog-boy" to get his attention, the configuration will work well for this user. In this way a user may set a particular word or phrase to be effectively a volume reduction password that his or her friends can use to get his or her attention. In general, setting a particular verbal utterance to be an identified volume reduction trigger utterance within the ambient environment, involves the user uttering the word or phrase to the media player during a configuration process. Alternate methods of configuring speech recognition systems known to the art may be used as well. In addition, one or more generic words commonly used to summon attention, such as, for example, "sir" or "help" or "excuse me," may be additionally optionally configured to also trigger the automated volume reduction methods if such words are captured in the ambient audio signal at a volume that exceeds a certain threshold.

Audio Mixing Embodiments:

In some embodiments of the present invention, the media player is operative to mix musical audio content derived from a stored media file with ambient audio content captured from a microphone local to the user. The methods and apparatus used to mix two separate audio signals into a single audio stream that may be listened to by a user is well known in the art and will not be described in detail herein, Regardless of the method used, a single audio signal is presented to the user through the headphones Of other similar sound display hardware, the signal audio signal including an audio combination of a musical media file accessed from a memory of the media player and an ambient audio signal derived from the signal captured by Microphone 95A. The relative volume of the two component audio signals as represented in the combined mix audio signal may be dependent at least in part upon a mixing balance setting supplied by the user through a user interface of the media player. In this way the user can listen to musical media content in audio combination with ambient audio signals from the local environment. It should be noted that the ambient audio signal content may be filtered or otherwise processed to extract extraneous noise and/or sound content that is outside certain magnitude and/or frequency limits or thresholds.

While such an inventive audio mixing function may enable a user to more easily hear sounds from within his or her natural surroundings in a controlled, and settable audio combination with music that he or she is listening to (including ambient sounds such as other speaking users, the user's own voice, and/or alarms and sirens), such a mixed audio signal may be unpleasant during times when such events are not occurring. For example, the user may be constantly distracted by ambient environment sounds in the mixed audio signal that are not important, relevant, or valuable for him or her to attend to. Thus some embodiments of the present invention include a further inventive method in which the relative volume balance of the mixed signal (i.e. the relative volume of the musical media content and the ambient microphone content) are selectively adjusted in response to detected ambient audio events. More specifically, the relative volume of the microphone content is automatically increased with respect to the musical media content, for a period of time, in response to detected characteristic ambient audio events within the ambient audio signal stream. The detected characteristic ambient audio events may include, but are not limited to (A) the detection of the media player's name being uttered within the ambient audio signal, (B) the detection of the media player's own voice within the ambient audio signal, and/or (C) detection of an alarm or siren sound present within the ambient audio signal.

In this way, a user may be listening to an audio signal that is a mixed audio combination of a musical media file and an ambient microphone signal, the relative volumes being such that the musical media file is substantially louder than the ambient microphone signal as presented within the mixed audio content. In response to the detection of a characteristic ambient audio event such as A, B, or C, above, the routines of the present invention are configured to adjust the relative volumes in the mixed audio signal for a period of time, the adjustment such that the representation of the ambient audio signal is made substantially louder relative to the musical media content. Thus if a third party calls the name of the user of the media player, upon detection of that name being uttered, the user is presented with an audio mix of musical media and microphone data such that the user can easily hear the ambient environment as mixed with the musical media. When the period of time is over the relative volume levels are automatically returned to their nominal relative volume (i.e. a nominal relative volume such that the musical media content is substantially louder than the microphone content), It should also be noted that in some embodiments the nominal relative volume levels of the two signals may be set such that the volume of the ambient microphone content is substantially zero at times when an ambient audio event has not been detected. In this way the user only hears the musical content until and unless an ambient audio event is detected. In response to such a detected ambient audio event for example an event such as A, B, or C above), the automatic routines of the present invention adjust the relative volumes of the two signals such that the ambient environment microphone signal is no longer zero, instead being substantial with respect to the musical media content. In this way the pure musical content is played to the user until an ambient audio event is detected, then in response to the detected event a mixed audio signal is presented with both musical content and ambient audio content such that ambient audio content is clearly audible at a substantial relative volume. This change in mix volumes may be abruptly enacted or gradually enacted. This mixed audio signal with new volume relative volume levels lasts for a period of time. Then after the period of time the routines of the present invention automatically resume the audio to the nominal volume levels (in this case the ambient audio content going to zero volume). The resumption of nominal values may be abrupt or gradual.

Note—in some embodiments the mixed volume level is such that the musical audio content is gradually decreased down to substantially zero while the ambient audio musical content is gradually increased up to the prior music volume level, Such a cross-fade enables the music to fade out while the ambient audio content fades in. This lasts for a period of time. After the period of time, the process reverses, the ambient audio content fading out to zero volume and the musical content fading back to its pre-event nominal volume.

User Interface: In some embodiments of the present invention the media player includes dedicated user interface elements such as buttons, touch screen elements, and/or other manual or vocal commands that enable a user to override the automatic volume adjustment methods disclosed herein. For example, a button may be provided upon the portable media player that causes the volume levels to return to nominal values upon it being pressed. In this way the automatic ambient sound responsive volume adjustment routines of the present invention may cause the musical media content to automatically drop in volume during an event, such as a user speaking or an alarm sounding, and the user may override the automatic volume reduction by pressing the dedicated button or engaging the other dedicated user interface element. In this way the user can quickly resume the volume back to nominal levels, if for example, the user realizes that the alarm is not relevant to him and/or the other detected ambient audio event is not important.

External Electronic Alert Signal Employed for Automatic Volume Reduction:

In some embodiments of the present invention, the automatic volume reduction routines of the present invention that are active to attenuate the volume of a playing media file to a user for a period of time and then resume volume to nominal levels thereafter, may be triggered by an external electronic signal alert detected by a wireless transceiver of the media player. In this way an external electronic device in the user's local environment, such as a home automation system, a home security system, a personal computer, or some other separate electronic device, can send a specific electronic alert signal to the portable media player of the user. In response to receiving the specific electronic alert signal from the separate device within the user's local environment, the media player may automatically reduce the playing volume of the media content to the user for a period of time. This feature is useful in a ubiquitous computing environment in which a plurality of intelligent devices may coexist within a local environment of the user as he or she listens to music through the portable media player. A separate device, such as a home security system, may wish to gain the user's attention and thus can issue an electronic alert to the media player which causes the volume to be reduced for a period of time. In some embodiments, the electronic alert signal system is used in combination with the features of the ambient sound responsive media player disclosed herein.

Thus as disclosed on the pages herein, an ambient sound responsive media player is operative to alert a media player user to ambient audio events within his Or her local environment that he or she may not be able to easily hear while listening to the currently playing media content. Furthermore the present invention enables the user to attend to the ambient audio event for a period of time following the detected ambient audio event by lowering the music volume during that period of time. The present invention may support one or more of a variety of ambient audio events, including the verbal call of the user's name by another party in the local environment, an siren or alarm or other emergency sound audible within the local environment, the utterance of a password phrase by another party within the local environment, a verbal utterance identified to be from a user with a particular verbal identity within the local environment, and/or a verbal utterance identified to be from the media player user himself. In these ways the present invention is operative to enable a user to listen to music without cutting himself off from important audio events within his or her local environment. In these ways some embodiments of the present invention also are operative to allow third party users to gain the verbal attention of a media player user who may be listening to loud music through headphones. In these ways some embodiments of the present invention are also operative to enable a media player user to hear emergency sounds that may be important within his or her local environment And finally, in these ways some embodiments of the present invention are also operative to enable a media player user to spontaneously begin engage in a conversation and not talk too loud, because he or she can more easily hear himself or herself while talking.

The foregoing described embodiments of the invention are provided as illustrations and descriptions. They are not intended to limit the invention to the precise forms described. In particular, it is contemplated that functional implementation of the invention described herein may be implemented equivalently in hardware, software, firmware, and/or other available functional components or building blocks. While the invention herein disclosed has been described by means of specific embodiments, examples and applications thereof, numerous modifications and variations could be made thereto by those skilled in the art without departing from the scope of the invention set forth in the claims.

The invention claimed is:

1. A method comprising:
   capturing an ambient audio signal;
   processing the ambient audio signal to determine whether one or more characteristic forms are present within the ambient audio signal;
   automatically reducing an output of a media player from a first volume to a second volume gradually over a period of time if the one or more characteristic forms are present within the ambient audio signal; and
   maintaining the output of the media player at the second volume for a predetermined time before returning the output from the media player to the first volume, wherein the length of the predetermined time is based on the one or more characteristic forms, and wherein a first characteristic form is associated with a first length of predetermined time and a second characteristic form is associated with a second length of predetermined time different from the first length of predetermined time.

2. The method of claim 1, wherein reducing the output further comprises reducing the output when one or more characteristic forms exceeds a volume threshold.

3. The method of claim 2, wherein the volume threshold is predetermined.

4. The method of claim 2, wherein the volume threshold is determined based on at least one of the group consisting of: the first volume and the second volume of the output of the media player.

5. The method of claim 2, wherein the volume threshold is determined based on the volume of the ambient audio signal.

6. The method of claim 1, wherein the second volume is a fixed percentage of the first volume.

7. The method of claim 1, wherein the second volume is based at least in part upon a volume level of the one or more characteristic forms.

8. The method of claim 1, further comprising:
   resuming the output of the media player in a manner that is performed gradually over a period of time.

9. The method of claim 1, wherein the one or more characteristic forms are selected from the group consisting of a name or personal identifier of a user of the media player, the voice of a user of the media player, and an alarm or siren.

10. A method of adjusting an output of a media player comprising:
    capturing an ambient audio signal;
    processing the ambient audio signal to determine whether one or more characteristic forms are present within the ambient audio signal;
    mixing at least a portion of the ambient audio signal with a first output of a media player to generate a second output of the media player, if the one or more characteristic forms are present within the ambient audio signal, wherein the mixing to generate a second output is conducted in a manner that is performed gradually over time; and
    maintaining the output of the media player at the second volume for a predetermined time before returning the output from the media player to the first volume, wherein the length of the predetermined time is based on the one or more characteristic forms, and wherein a first characteristic form is associated with a first length of predetermined time and a second characteristic form is associated with a second length of predetermined time different from the first length of predetermined time.

11. The method of claim 10, wherein mixing at least a portion of the ambient audio signal with a first output further comprises mixing when one or more characteristic forms exceeds a volume threshold.

12. The method of claim 11, wherein the volume threshold is determined based on at least one of group consisting of: the first output and the second output of the output of the media player.

13. The method of claim 11, wherein the volume threshold is determined based on the volume of the ambient audio signal.

14. The method of claim 10, wherein a first volume of the at least a portion of the ambient audio signal is substantially relative to a second volume of the first output of the media player, such that the at least a portion of the ambient audio signal is clearly audible.

15. The method of claim 10, further comprising:
resuming the first output of the media player in a manner that is performed gradually over a period of time.

16. An apparatus for use in a media player comprising:
a microphone; and
one or more processors adapted to:
process an ambient audio signal received by the microphone to determine whether one or more characteristic forms are present within the ambient audio signal,
gradually adjust an output of a media player, if the one or more characteristic forms are present within the ambient audio signal, and
maintaining the adjusted output of the media player for a predetermined time before returning the output from the media player to a pre-adjusted volume, wherein the length of the predetermined time is based on the one or more characteristic forms, and wherein a first characteristic form is associated with a first length of predetermined time and a second characteristic form is associated with a second length of predetermined time different from the first length of predetermined time.

17. The apparatus of claim 16, wherein the one or more characteristic forms are selected from the group consisting of a name or personal identifier of a user of the media player, the voice of a user of the media player, and an alarm or siren.

18. The apparatus of claim 16, wherein the one or more processors are adapted to reduce the output of the media player from a first volume to a second volume.

19. The apparatus of claim 16 wherein the one or more processors are adapted to mix at least a portion of the ambient audio signal with a first output of the media player to generate a second output of the media player.

* * * * *